United States Patent [19]

Peil

[11] 3,763,439

[45] Oct. 2, 1973

[54] VOLTAGE CONTROLLED OSCILLATOR FOR INTEGRATED CIRCUIT FABRICATION

[75] Inventor: William Peil, North Syracuse, N.Y.

[73] Assignee: General Electric Company, Syracuse, N.Y.

[22] Filed: Aug. 21, 1972

[21] Appl. No.: 282,443

[52] U.S. Cl. ............ 331/8, 178/69.5 CB, 325/421, 331/20, 331/34, 331/108 D, 331/116 R, 331/177 R

[51] Int. Cl. .......................... H03b 3/04, H03b 5/36

[58] Field of Search ............... 331/8, 20, 34, 108 D, 331/116 R, 177 R; 178/69.5 TV, 69.5 CB; 325/421

[56] References Cited

UNITED STATES PATENTS 3,691,475 9/1972 Mouri et al. ............................ 331/8

*Primary Examiner*—Roy Lake
*Assistant Examiner*—Siegfried H. Grimm
*Attorney*—Richard V. Lang et al.

[57] ABSTRACT

A voltage controlled oscillator is described particularly suited for APC and AFC applications and having a wide phase shift control range. The oscillator is adapted for IC fabrication with a minimum "pin" count and a minimum of outboarded components. The active portion of the circuit takes the form of a modified four-quadrant multiplier, with an external high Q resonant circuit being coupled in a feedback path between a load common to two upper rank transistors and the input to one lower rank transistor. The D.C. control voltage is applied as an interbase potential to the upper rank transistors to control the current in the right and left branches of the multiplier, and a phase shift network is inserted in one branch to restrict the phase difference between the two branches to less than 180°, or typically 135°. Controlled parasitic delays introduce additional delay in the active circuit approximately equal to one half this phase difference. These provisions insure a regenerative condition and prevent pulling of the resonant circuit in either the direction of excessive phase advance or phase delay. The phase shift range exceeds 90°, typically equalling the phase difference between the current in the two branches.

5 Claims, 4 Drawing Figures

Patented Oct. 2, 1973 3,763,439

VOLTAGE CONTROLLED OSCILLATOR FOR INTEGRATED CIRCUIT FABRICATION

BACKGROUND OF THE INVENTION

1. Field of the Invention

The invention relates to voltage controlled oscillators and more particularly to oscillators of high accuracy whose frequency is subject to precise voltage control. The oscillator finds typical application in an automatic frequency or phase control network wherein an error voltage of suitable polarity is derived to hold the oscillator to a stable frequency and/or phase. One such application is in the generation of a wave at color subcarrier frequency for use in a color television receiver. The oscillator may also be applied to systems wherein voltage tuning is sought for other purposes.

2. Description of the Prior Art

The classic voltage controlled oscillator includes a resonant circuit and a reactance "tube" which injects differing amounts of quadrature current into an oscillating circuit as a function of a control voltage, the tube becoming a virtual variable reactance. In the conventional configuration the reactance tube presents an inductive or capacitive reactance. With the advent of semiconductors, voltage sensitive capacitor diodes came to perform this voltage tuning function. Today, however, vacuum tubes as well as voltage sensitive capacitor diodes are undesirable for use in low cost integrated circuit fabrication. The latter devices, while semiconductors, require specialized processing normally placing them in the case of "discrete" components which cannot be integrated. "Discrete" components are thus to be avoided wherever possible in integrated circuit design because of their intrinsically higher individual expense and the cost of connecting them into the balance of the integrated circuit. This latter expense is treated as the cost of adding "pins." Thus, the need has arisen for an oscillator circuit which is readily fabricated using integrated circuit design techniques with a minimum resort to discrete components and a minimum pin count.

A review of oscillators suitable for IC fabrication is contained in an article by Mr. N. P. Doyle in the IEEE BTR Transactions of Feb. 1970 entitled "A Comparison of Solid State Sub-Carrier Oscillators for Color TV Receivers." This article reviewed several approaches to providing waves of color sub-carrier frequency of sufficient accuracy for color demodulation and treated automatic phase control systems generally. In that article and in another article by Mr. John L. Rennick in the *IEE BTR Transactions* of Oct. 1969, pages 224–227, entitled "An IC Approach to the Subcarrier Regeneration Problem" an oscillator employing IC techniques was described. The oscillator described in the Rennick article employs a crystal controlled oscillator in an automatic phase control network. The active portion of the oscillator circuit includes two transistor differential amplifiers. One differential amplifier is arranged in an upper rank with the paired emitters of its transistors coupled to the collector of one transistor in the lower rank differential amplifier. The crystal operates in a series resonant mode, and is coupled between the collector of a transistor in the upper rank and the base of the second lower rank transistor to provide a regenerative feedback connection. Impedances providing a 45° phase shift advance coupled to the collectors of the upper rank transistors give a 45° range of current phase shift, depending upon whether the D.C. interbase control potential turns on the right or left upper rank transistors.

The oscillator described in the Rennick article exhibits a rather narrow (45°) phase shift range, tending also to limit the sensitivity to D.C. control and to reduce the pull in range. The placement of the phase shift network at the collectors of the upper rank transistor pair, a low impedance point, requires a large non-integrable capacitor, and the oscillator circuit requires three pins to interconnect the active circuit with the resonant crystal circuit. In addition the lead and lag networks are not isolated from one another — in that they share the same phase shift capacitor; and large swings in phase are not possible without unacceptably large variations in amplitude.

The present invention is intended to provide an improved voltage controlled oscillator for this same application.

SUMMARY OF THE INVENTION

It is accordingly an object of the present invention to provide an improved voltage controlled oscillator.

It is a further object of the present invention to provide an improved voltage controlled oscillator that is particularly adapted for use in an automatic phase control network.

It is an additional object of the present invention to provide a voltage controlled oscillator having an increased phase shift range for increased sensitivity, and an increased pull-in range.

It is another object of the present invention to provide a voltage controlled oscillator optimally suited for integrated circuit fabrication.

It is another object of the present invention to provide an improved voltage controlled oscillator that is adapted for use in an automatic phase control network and which is doubly balanced to avoid feedthrough of the control voltage into the control loop.

It is a further object of the present invention to provide an improved voltage controlled oscillator suitable for use with a crystal which provides both an effective inductive and an effective capacitive reactance in response to a voltage control, permitting the crystal to operate about its natural frequency on the average.

These and other objects of the invention are achieved in a voltage controlled r.f. oscillator by the use of a first circuit branch having r.f. gain comprising a first pair of transistors in an upper rank, having their emitters paired and connected to the collector of a third lower rank transistor; a second circuit branch of similar configuration comprising a second pair of upper rank transistors, having their emitters paired and connected to the collector of a fourth lower rank transistor, one collector from each pair of upper rank transistors being coupled to a common output load impedance; means coupling the emitters of the lower rank transistors to a common current source for balancing the emitter currents in said upper rank in response to base excitation of one lower rank transistor to produce in the output load impedance an output signal from said first branch ideally equal and out of phase to that produced from said second branch; a phase shift network in said first branch at the collector of the third transistor for reducing the actual phase difference between the currents in said two branches substantially below 180° but in excess of 90°; a feedback path coupled between the load impedance and the base of the third transistor comprising a high Q resonant circuit, the accumulated parasitic delay around the loop at resonance, including forward and feedback paths, approximately one-half the phase difference between said individual branches to insure a regenerative feedback condition from currents in either branch; and means for applying an interbase D.C. control potential to each upper rank transistor pair, poled for double balanced operation to produce an r.f. output quanity whose phase is continuously variable within said phase difference from a virtual lead to a virtual lag, each being substantially less than 90°, for inducing a compensatory reactance change in said resonant circuit and a corresponding change in the phase or frequency of resonance of said oscillator.

In a practical embodiment, the phase shift network produces a delay of 45° and may be directly integrated. It requires a series resistance and the capacitance of the collector junction of the third transistor supplemented by additional (10 – 12 pf) junction capacitance to substrate. The desired value of parasitic delay around the feedback loop may be achieved by adding external capacitance coupled to the base of the third transistor. The oscillator circuit requires only two pins for interconnection to the external resonant circuit. Under voltage control, the oscillator exhibits a typical phase shift range of from 140° – 160°.

BRIEF DESCRIPTION OF THE DRAWING

The novel and distinctive features of the invention are set forth in the claims appended to the present application. The invention itself, however, together with further objects and advantages thereof may be best understood by reference to the following description and accompanying drawings in which:

DESCRIPTION OF THE PREFERRED EMBODIMENT

Figures 1, 2:
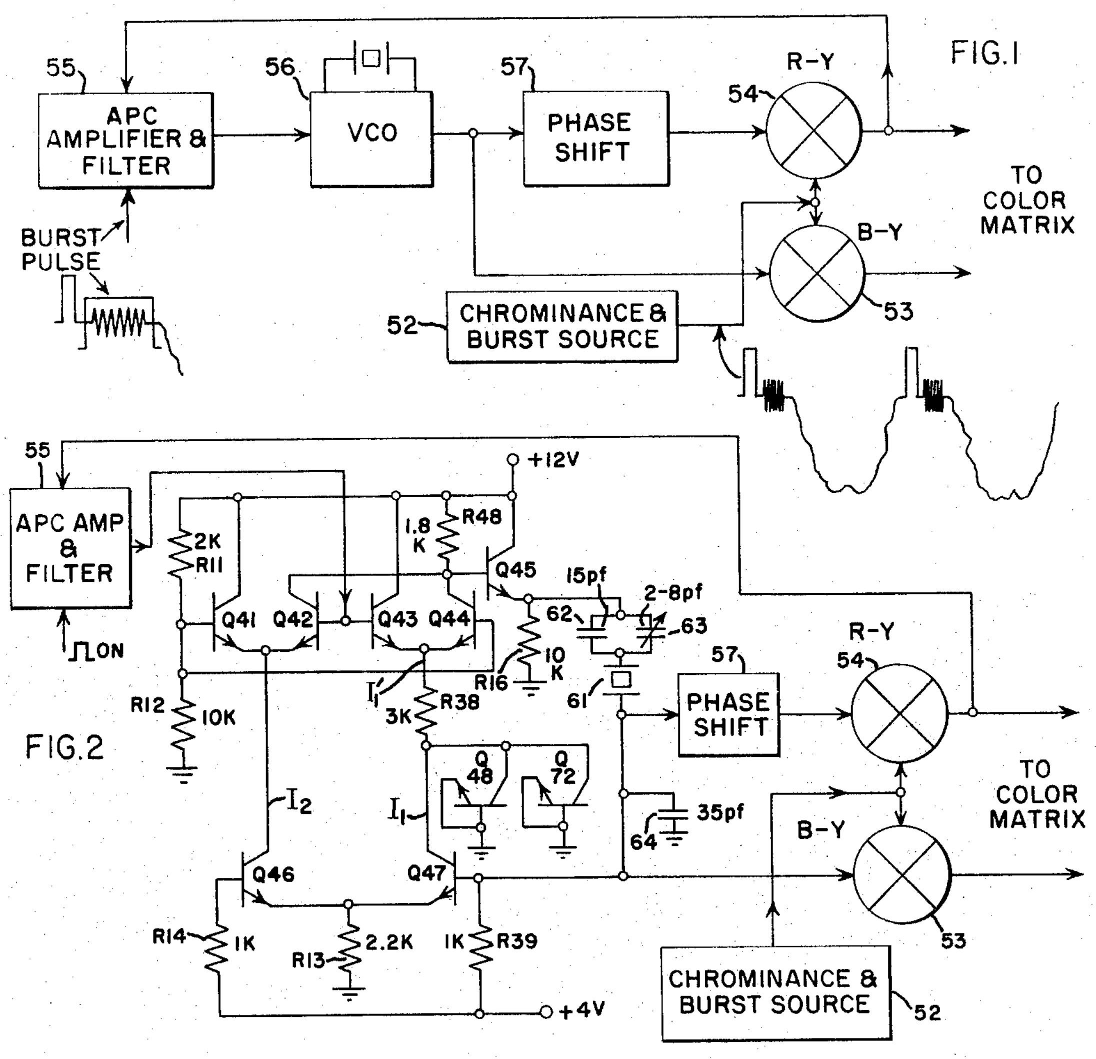
FIG. 1 is a block diagram of a phase control network in a television receiver wherein Applicant's novel voltage controlled oscillator finds typical application.
FIG. 2 is an illustration of an automatic phase control network wherein an embodiment of the present novel voltage controlled oscillator is illustrated in circuit diagram form.

A block diagram of a portion of a television receiver in which the present novel voltage controlled oscillator may be employed is illustrated in FIG. 1. In particular, the illustration includes that portion of the television receiver which demodulates the color portions of the television signal and which includes the oscillator in an automatic phase control loop to produce a locally derived color subcarrier for use in the color demodulation process.

The block diagram may be seen to comprise the six elements 52 through 57, including a pair of four quadrant multipliers 53, 54 each having two inputs and deriving an output, a crystal stabilized, voltage controlled oscillator 56, a phase shift network 57, a gated automatic phase control amplifier and filter 55 and the source 52 supplying the burst and chrominance to the two multipliers.

The source 52 of chrominance and burst is applied to one pair of inputs of the four-quadrant multipliers, while the crystal stabilized, voltage controlled oscillator 56 is coupled (without phase shift) to one input of the four-quadrant multiplier 53, and through the phase shift network 57 to one input of the four-quadrant multiplier 54. The gated automatic phase control amplifier and filter 55 derives a control signal from the output of multiplier 54 and applies a filtered control voltage to the VCO 56.

During video, assuming that the voltage controlled oscillator produces a wave of color subcarrier frequency in correct phase, the four-quadrant multiplier 53 functions as a demodulator producing a product term in its output which contains the demodulated B – Y color signal. Simultaneously, the four-quadrant multiplier 54 functions as a second demodulator producing a product term in its output which contains the demodulated R – Y color signal. These two color difference signals are subsequently matrixed with the luminance (Y) signal to obtain the requisite R, G, B color signals required for operation of the picture tube in a color television receiver.

During burst, the four-quadrant multiplier 54 produces a D.C. phase error signal whose amplitude is zero when the locally supplied oscillator wave is in quadrature with the color burst and positive or negative when not in quadrature. In order to insure a proper phase relationship between the output of the oscillator 54 and the chrominance signal, the D.C. phase error signal from the four-quadrant multiplier 54 is fed back in an automatic phase lock loop to the automatic phase control amplifier and filter 55, where it is applied, as will be described, for automatic control of the phase of the voltage controlled oscillator 56.

As implied above, the color demodulation and phase control functions entail the use of the demodulators 53, 54 on a time shared or time multiplexed basis. This is possible because of the alternating transmission of video and control signals.

The local source 52 provides a demodulated video signal to the color demodulators 53, 54 suitable for time multiplexed operation. The video output waveform of source 52 is illustrated in FIG. 1 with some horizontal scale distortion, exaggerating the horizontal blanking intervals. The waveform may be seen to include the horizontal synchronizing pulses, the color burst, followed by the video portion of the signal. While not evident from the illustration, the video portion of the waveform contains the chrominance information modulated upon a suppressed color subcarrier. Normally, it is desirable that the chrominance portion of the video signal appear at essentially full bandwidth and without attenuation at the input of the chrominance demodulators. The luminance portion of the signal may also be present but is unnecessary in this portion of the circuit and often undesirable. Normally, the luminance is attenuated, in respect to the chrominance, the amount depending upon the linearity of the color demodulators. A suitable demodulated video waveform is normally available in any television receiver after video detection and prior to blanking. The specific time multiplexed color demodulator configuration so far described is not itself a part of the present invention but is the subject of copending application of Mr. H. W. Abbott, Ser. No. 282,442, entitled "Multiplex Color Television Demodulator," assigned to the Assignee of the present application, filed concurrently herewith.

When such a signal as that provided by source 52 is applied to the demodulators 53, 54, they process both the video signal to derive the color signal and the burst to derive a phase error signal as outlined above. Since the demodulation process is essentially continuous, the VCO 56 is required to supply a wave continuously at color subcarrier frequency and of suitable phase to the demodulators.

Let us now consider the formation of the phase error signal applied to the VCO 56 in greater detail. If the wave derived from the voltage controlled oscillator 56 is momentarily out of precise phase quadrature with the burst signal applied to one modulator input, the four-quadrant multiplier (54) will generate a D.C. error signal whose sign will indicate whether the local oscillator is at that moment of a lesser or greater phase angle difference from burst than precise quadrature. The magnitude of the error voltage will indicate the actual phase discrepancy. Since error sensing can only occur during transmission of the color burst, the automatic phase control amplifier and filter 55 is gated to derive a sample only during this period. However, as noted above, the alternating color signal and burst demodulation process requires the essentially continuous supply of waves at color subcarrier frequency from the VCO. Thus, the VCO's operation must not be interrupted by intermittence in the error signal. Continuous VCO operation is facilitated in the APC amplifier 55 by a filter which stores the individual error signals from successive bursts to derive an average D.C. value. This average D.C. value is continuously applied to the voltage controlled oscillator to correct its phase to the desired quadrature relation. Assuming a locked in oscillator condition, the time constant of the filter permits the oscillator output to reach an accurate phase relation in quadrature to the burst at the end of the color burst and to store this value throughout the following horizontal line with sufficient accuracy to preserve the desired detection angles. Thus, after each horizontal line interval the need for correction will be sensed and then applied to readjust the voltage supplied continuously to the oscillator 56.

Precise timing of the gate at the input of the automatic phase control amplifier 55 is achieved by a pulse timed to include the period that the color burst is being transmitted. A suitable timing signal is available in a television receiver from the horizontal sweep circuit which develops a slightly delayed pulse during horizontal flyback. The actual gating pulse should be of suitable magnitude to turn on the APC gate, which is normally off during video, into an "on" condition during burst. In respect to timing, the gating pulse should commence slightly before the color burst and continue until slightly after the color burst has terminated to allow for timing errors in the receiver and transmitter. A suitable gating pulse is illustrated in FIG. 1 at the input to 55.

The foregoing application of Applicant's novel voltage controlled oscillator 56 to the synchronous demodulation of color television signals places certain requirements upon the oscillator. In particular, the oscillator must respond to a change in magnitude and polarity of a D.C. control voltage with a compensatory change in phase. Assuming locked in operation, this correction must occur within the burst period and the oscillator stability should be such as to maintain the oscillator within approximately 3° of the correct phase throughout the video portion following the burst. This requires high stability on the part of the oscillator, normally requiring a resonant crystal as illustrated. In addition, certain precautions must be taken to prevent driving the crystal beyond its proper phase control limits or otherwise exciting spurious responses. These matters will now be undertaken in connection with FIG. 2 which illustrates the circuit details of the novel voltage controlled r.f. oscillator including typical circuit values, suitable for integrated circuit fabrication. In FIG. 2, the other elements of the phase control loop remain in block diagram form.

The voltage controlled r.f. oscillator 56 comprises three transistor pairs Q41,Q42, Q43,Q44, and Q46,Q47 providing forward r.f. gain and arranged in a modified four-quadrant multiplier configuration, which is double balanced, an output emitter follower Q45, the resonant crystal (61), a phase shift network comprising R38 and the capacitance of Q47, Q48 and Q72, and sundry passive components.

The active circuit configuration providing forward r.f. gain is as follows: The transistor pairs Q41, Q42 and Q43,Q44 are arranged in an upper rank with their emitters paired. Each emitter pair (Q41, Q42; Q43,Q44) is led to the collector of a lower rank transistor (Q46,Q47, respectively). The third pair of transistors Q46, Q47 also has paired emitters, led through a common emitter resistance R13 to ground. The phase shift network comprising resistance R38 and the capacitances Q48, Q72 is coupled in the path between the collector of lower rank transistor Q47 and the upper rank pair Q43, Q44. The bases of the upper rank transistors Q41 and Q44 are joined as are the bases of upper rank transistors Q42 and Q43 for differential base excitation. The bases of upper rank transistors Q42, Q43 are then coupled to the output of the automatic phase control filter in block 55 which provides the D.C. error signal. The bases of upper rank transistors Q41, Q44 are not excited, but are returned to a voltage divider comprising resistance R11 and R12 coupled between a source of high positive potentials and ground. The collectors of transistors Q41 and Q43 are paired and directly connected to the same positive source. The collectors of transistors Q42 and Q44, which are active from the r.f. standpoint, are also paired and led through a load resistance R48 to the same positive source. This source is typically of from 12 to 18 volts.

The r.f. output from the paired collectors of Q42, Q44, which appears in load resistance R48, is coupled through emitter follower Q45 to one terminal of the resonant circuit comprising elements 61, 62, 63, 64. The lower rank transistor pair Q46, Q47, which provide r.f. excitation to the upper rank transistors, are also provided with differential base excitation. In particular, the base of Q47 is led to the other terminal of the resonant circuit 61–64. The base of transistor Q46, which is not provided with r.f. excitation, is led to a source of moderate biasing potentials (4V) through resistance R14. R39 provides a similar bias connection to the base of Q47.

Double balancing action arises from the foregoing circuit provisions. Assuming that a signal voltage is applied to the base of Q47, causing an increase in the emitter current of Q47, the resistance R13 is made sufficiently large (2.2K) such that a nearly equal decrease in emitter current will occur in Q46. In consequence, the emitter current in upper rank transistor pair Q43,Q44, which is derived from the collector of lower rank transistor Q47, incurs an increase, while the emitter current in upper rank transistor pair Q41, Q42, which is derived from the collector of lower rank transistor Q46, incurs an equal or "balanced" decrease. Assuming no interbase voltage imbalance in the upper rank transistors, the output at the collectors of Q42, Q44 in load resistance R48 will be zero or balanced. This is one mode of balancing.

Similarly, the differential base voltage which is applied to each upper rank transistor pairs is balanced. This results from the natural constant current action in the emitter path of Q43, Q44. This upper rank pair derives its current from Q47 which forces any current decrease in Q43 to occasion a nearly equal increase in Q44. Constant current action in the emitter path of Q41, Q42 of the same nature forces any current increase in Q41 to occasion a nearly equal decrease in Q42. Summing the collector currents of Q42,Q44, and assuming that the emitter currents to each upper rank pair (Q41,Q42 and Q43,Q44) are equal, the effect of the differential base excitation of the upper rank causes a zero or balanced output in load resistance R48.

This latter balancing mode has the advantage of preventing D.C. feedthrough when the configuration is used in an automatic phase control loop with D.C. potentials applied to the bases of the upper rank transistors. When a configuration has two such modes of balancing it is referred to as doubly balanced.

The foregoing double balancing action leads to four-quadrant multiplication when both input quantities are variable. Thus, as may be demonstrated mathematically, the output of an ideal multiplier is a vector product of the interbase potential and the differential emitter current of the upper rank transistors, the latter quantity being in turn a function of the interbase potential of the lower rank transistors. In the present configuration, which exhibits a modified form of four-quadrant multiplication, and assuming an r.f. interbase excitation applied to the lower rank transistors, a reversal in the polarity of an upper rank D.C. interbase potential from strongly positive to strongly negative will bring about a near reversal in phase of the r.f. output. The manner in which the circuit goes between these two extreme limits will now be discussed.

Consistent with four-quadrant action and assuming r.f. gain leading to oscillatory operation of the circuit, the lower rank transistors Q46, Q47 provide r.f. excitation through the emitter current supplied to the upper rank transistors. At the same time a D.C. control voltage from the APC filter 55 is applied as an interbase potential to the upper rank transistors. The polarity of the interbase potential determines whether the output r.f. current, which appears in the collector load R48, contains current primarily derived from the first branch of the circuit comprising the upper rank transistor pair Q43,Q44 and lower rank transistor Q47 (current $I_1$ in FIG. 3A) or current primarily derived from the second branch of the circuit comprising upper rank transistor pair Q41, Q42 and lower rank transistor Q46 (current $I_2$ in FIG. 3A). Increasing the magnitude of the interbase potential of the upper rank transistors tends to increase the magnitude of the r.f. output. Thus, since there is an effect upon both phase and amplitude of the output r.f. quantity, the operation resembles true four-quadrant multiplication.

The resemblance, however, to four-quadrant multiplication is strongly modified by the actual working circuit. In the actual circuit, the r.f. output is limited to a typically 135° variation in phase angle and to a substantially constant amplitude. These modifications flow from the provision of the phase shift network, the establishment of relatively low switching levels in the multiplier and the self-limiting effects of the lower rank circuit, and finally off resonance losses in the overall feedback circuit. These points will be undertaken after further discussion of the phase shift network.

Figure 3A:
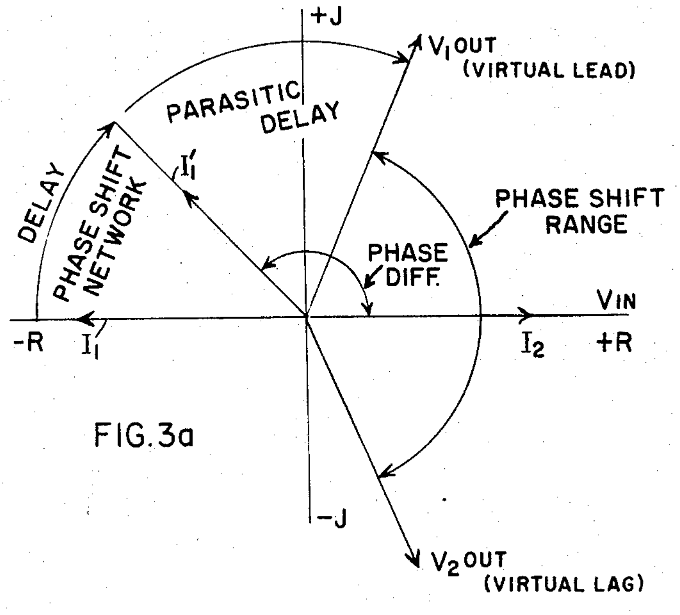
FIGS. 3A and 3B are vector diagrams illustrative of the operation of the voltage controlled oscillator.

As previously noted, the phase shift network is coupled in the first circuit branch in the connection between the collector of lower rank transistor Q47 and the paired emitters of upper rank transistors Q43, Q44. The phase shift network, which comprises the series connected resistance R38, further comprises the capacities to ground supplied by transistors Q47, Q48 and Q72. The transistors Q48 andQ72are not used for amplification and have their collectors paralleled with the collector of Q47. Their bases are grounded and their emitters may be grounded or open or paralleled with the collector, the latter being permissible when the collector bias is less than the emitter junction breakdown voltage. For reasons to be subsequently detailed, the phase shift produced by this network is typically 45° at r.f. subcarrier frequency and produces a 3 db attenuation. Thus, as seen in FIG. 3A, the r.f. current in the first branch will be delayed approximately 45°, and the amplitude attenuated to about 0.71 of its original value as shown by the vector $I_1'$.

Figure 3B:
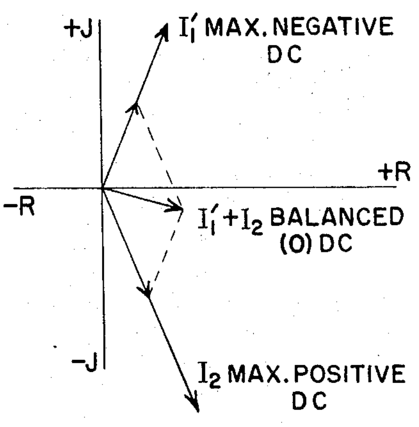

The factors which reduce the amplitude variation of the r.f. output may now be treated. Assuming that the interbase potential applied to the upper rank transistors is adequate to fully switch the upper rank transistor pairs, typically 250 mv, the resultant output will be either two arbitrary current units (all $I_2$), corresponding to positive polarity switching, or 1.4 arbitrary units (all $I_1'$), corresponding to negative polarity switching. Thus, there is a nominal 30 percent variation in output amplitude between these two extremes. At zero interbase potential, assuming that switching occurs at twice the current for balance, (a desirable operating condition) the resultant r.f. output current is the sum of two vectors of magnitude 1.0 and 0.71, at 135° phase separation, or approximately 0.71 units. Thus, the phase shift network prevents the cancellation which would occur if the vectors were 180° opposed and intrinsically prevents output amplitude variation beyond those limits. These three D.C. control conditions are shown in FIG. 3B. The factors noted above prohibit the resultant r.f. currents from varying outside of the illustrated range.

Besides the foregoing factors restricting amplitude variation, however, there are several others. FIG. 3B shows the magnitude of the phase shifted currents under open loop conditions. In actual operation the attenuation of the crystal tends to reduce the magnitude of the $I_1'$ and $I_2$ currents when the circuit is off resonance and the limit cycle of the oscillation when the loop is closed is well defined and abrupt due to the limiting action of the differential amplifier comprising Q46 and Q47. Thus, under closed loop operation the effect of the control voltage is to change phase (frequency) while holding the magnitude of the waves essentially constant. This justifies the use of constant length vectors for the output quantities $V_1$ out and $V_2$ out, illustrated in FIG. 3A.

Completing the oscillator r.f. circuit are the connections which lead from the active circuitry to the crystal resonant circuit. The crystal 61 operates in a series resonant mode. It is provided with a pair of series connected capacitors, mutually paralleled, one fixed (62) and the other (63) adjustable, coupling the crystal to the emitter follower load R16 where the r.f. signal from the upper rank transistors Q42, Q44 appears. The adjustable capacitor 63 permits a slight retuning of the circuit. The free terminal of the crystal 61 is connected to the base of lower rank transistor Q47 and an additional capacitor 64 is coupled between this point and ground for increasing the phase shift around the "loop," as will be described. The oscillator output is supplied to the demodulators 53 and 54 (through the phase shift network 57) by connection to the load resistance(R39), connected between the base of transistor Q47 and ground.

The foregoing voltage controlled oscillator, oscillates at a frequency which is defined to a high accuracy by the frequency of the resonant crystal, while deriving highly precise phase corrections under D.C. voltage control from the automatic phase control circuit. The frequency of oscillation may be pulled up or down from the actual resonant frequency of the crystal to the precise frequency and to the precise phase required for synchronous demodulation.

The manner in which oscillations are sustained and advanced or retarded in phase by the D.C. control voltage will now be explained with primary reference to FIGS. 3A and 3B. Initially, let us assume that there is no parasitic lag in the active circuitry.

Let us further assume that the transistors Q42, Q43 are conductive and that the transistors Q41, Q44 are nonconductive as a result of a positive D.C. error signal from the phase control network. Let us further assume that a small positive step voltage (Vin) is applied to the base of the transistor Q47. This step voltage will bring about an increase in emitter current flow in Q47, a decrease in the emitter-base voltage of Q46, a decrease in the emitter current in transistor Q46 and a reduction in the emitter and collector current ($I_2$ in FIG. 3A) in transistor Q42. In consequence, an increase in voltage appears at the collector load R48 of transistor Q42. This is coupled through the emitter follower Q45 as an in-phase, regenerative signal in resistance R16 to the resonant circuit. Thus, the circuit in branch 2 comprising transistors Q46, Q41, Q42, when turned on by a positively poled D.C. error signal tends to produce a regenerative output in response to a signal (Vin) applied to the base of Q47.

Next, let us assume that the D.C. error signal voltage is of reverse or negative polarity. When this occurs a small positive voltage applied to the base of the transistor Q47 brings about an increase in emitter current in Q47, an increase in the emitter current of Q44 and a consequent increase in collector current in Q44 and a degenerative decrease in signal voltage in the load R48. Neglecting the effect of the phase shift network (comprising R38, Q47, Q48, Q72), the current in the first branch provides a degenerative signal current ($I_1$ in FIG. 3A) to the resonant circuit. The phase shift network delays this current typically 45° and reduces its amplitude, as noted earlier. Assuming Vin to be an r.f. voltage at subcarrier frequency, the vector $I_1'$, in FIG. 3A illustrates these two modifications.

An examination of FIG. 3A now suggests the problem of maintaining the conditions for oscillation. The phase difference between the current in branch one and branch two is 135° at subcarrier frequency and sweeps from degeneration to regeneration. This poses the obvious danger that the circuit may be driven out of oscillation under D.C. control when the phase variation becomes degenerative. This danger is avoided by careful control of parasitic delays.

Assuming that at the exact subcarrier frequency, the resonant crystal exhibits zero reactance, the parasitic delays around the oscillator, including the forward and feedback paths, should therefore be set so that the phase swing is centered about a regenerative condition to avoid a degenerative condition. Assuming 135° phase swing, this is provided by an additional "parasitic" delay, ideally equal to one-half the phase swing or 67-½°.

The effect of this parasitic delay is illustrated in FIG. 3A by the vectors designated $V_1$ and $V_2$ out which have been rotated clockwise 67-½°. This delay may be produced as a result of an accumulation of delays such as the time delay (25°) attributable to capacitances associated with the output of Q42, Q44, accumulated transistor delays (10°), and finally the delay attributable to the series resistance of the crystal 61 and the capacitor 64 (30°) coupled in shunt with the input of Q47. Normally, the last element (capacitance 64) provides a convenient means for adding delay to the extent needed.

A second consequence of the indicated parasitic phase rotation is that it avoids over pulling the crystal. The $V_1$ output voltage has a virtual lead of 67-½° and the $V_2$ output voltage has a virtual lag of 67-½° from zero or regenerative phase in the ideal adjustment. Since the oscillator will resonate at the frequency where the total loop phase shift is zero degrees, corresponding to zero reactance, the crystal will be required to supply a compensatory phase shift lying within the same limits in the "pulling" process. In principle, the crystal can provide a nearly 90° inductive reactance or a nearly 90° capacitive reactance as the frequency is shifted above and below resonance. In fact, however, attaining the last few degrees is difficult since the crystal is likely to jump into another mode, and since greatly increased gain is required of the active circuitry. Thus, the present circuit limits the pulling of the crystal in the described adjustment to a point 22-½° short of the 90° corresponding to pure reactance. The actual range of frequency shift depends upon the Q of the crystal. Assuming a Q of 10,000, the pulling range is of the order of 1 kilohertz.

Assuming that the phase lock loop entailing the automatic phase control amplifier and filter 55 and the voltage controlled oscillator 56 are properly functioning, a properly phased r.f. output will be produced in the oscillator 56 and applied through the phase shift network 57 to the R – Y demodulator 54 and directly to the B – Y demodulator 53. Furthermore, in the phase control loop, the double balancing, which is not affected by the phase shift network, prevents the undesirable feedthrough of D.C. into the APC loop, preventing loop instability from this source.

The phase shift network involving R38, Q47, Q48, Q72 need not produce the precise 45° phase shift suggested by way of example. Typically, it provides from 20° to 50° phase shift at r.f. frequency. As noted above, if the shift is appreciably less than 20°, the oscillator active circuitry may develop problems with sufficient gain as the regenerative feedback component falls to too low a value or as the crystal is required to pull perilously close to 90°. Phase shifts appreciably over 50° require large amounts of capacity, and if the oscillator configuration is integrated, such capacities will consume undesirably large amounts of area on the chip. In addition, since the phase shift range in the present arrangement is intrinsically double that of those reactance systems, which are limited to 90° or less, there seems to be little point in sacrificing this advantage by unnecessarily increasing the phase shift beyond the amount necessary to avoid the dangers outlined. Thus, 20° to 50° appear to be reasonable limits to the phase shift network for IC applications, permitting a phase shift control range of 130° – 160°.

The accumulated parasitic delay, augmented particularly by the capacitor 64, which in the ideal case is half the phase difference between the currents in the two branches, need not possess this exact value. When the circuit entails a crystal, the crystal is normally not precisely symmetrical. Accordingly, one may find it desirable to retain some asymmetry in the active circuitry. One should in that event adjust the parasitic delay so that at the limits to the phase shift range, the degenerative or over pulling conditions noted above are avoided.

The invention should not be regarded as confined to the precise details disclosed by way of example, since many modifications may be made without departure from the inventive principles. While the upper rank transistors have been driven with a "single ended" interbase potential, one may also provide the interbase potential with a "push-pull" drive. This will provide additional gain, at the cost of requiring an additional "pad" in the APC filter. In IC applications, an additional pad is normally a disadvantage if the circuit is to be used in a complex IC configuration where pads are a scarcity. Similarly, the oscillator need not be used with a crystal resonant element in all applications. When used in a television receiver for subcarrier regeneration, however, the requirements for high frequency stability normally dictate a crystal. Other APC or AFC loops are not so demanding.

Furthermore, while the voltage control has been employed to return the oscillator to a standard frequency, the voltage control may also be used to tune an oscillator over a range of frequencies. The tuning range under these circumstances will be extended if the resonant circuit is of more modest Q.

The oscillator circuit, while intended for "integration," may, of course, be used with discrete components. While providing a virtual leading and a virtual lagging phase correction of a resonant circuit, it achieves these ends with the economic use of parasitic and capacitive elements alone, avoiding the need for costly inductive elements.

In terms of the advantages of the oscillator circuit for integrated circuit fabrication, the "pin" or "pad" count is minimum. The VCO loop normally requires a pad at the point of introduction of the D.C. control voltage since a large nonintegrable filter capacitor is required at this point. The active circuitry of the oscillator, however, requires only two pins. These are required at the points of insertion of the crystal. In particular, the phase shift network in the first circuit branch of the active circuit uses only integrable circuit components and avoids the need for any pins. Similarly, the parasitic delay element 64 is readily coupled to the pin already provided for the crystal. Thus, the circuit need for pins is restricted to no more than two.

What is claimed is:

1. A voltage controlled r.f. oscillator comprising:

a. a first circuit branch having r.f. gain comprising a first pair of transistors in an upper rank having their emitters paired and connected to the collector of a third, lower rank transistor, b. a second circuit branch having r.f. gain comprising a second pair of transistors in an upper rank having their emitters paired and connected to the collector of a fourth, lower rank transistor, one collector of said first pair and one collector of said second pair being coupled to a common output load impedance.

c. means coupling the emitters of said lower rank transistors to a common current source for balancing the emitter currents of said upper rank in response to base excitation of one lower rank transistor, said excitation ideally producing in said output load impedance an output signal from said first branch equal and 180° out of phase to that produced from said second branch, d. a phase shift network in said first branch coupled to the collector of said third transistor, which in response to base excitation thereof, reduces the phase difference between the currents in said two branches and appearing in said output load impedance to a value substantially below 180° but substantially in excess of 90°, e. a feedback path coupled between the load impedance and said base of said third transistor including a high Q resonant circuit for establishing resonant conditions substantially at the resonant frequency thereof but subject to pulling upon variation in the resultant phase shift in said r.f. gain branches, the accumulated parasitic delay around the loop at resonance, including forward and feedback paths, approximately one-half the phase difference between said individual branches to insure a regenerative feedback condition from currents in either branch; and f. means for applying an interbase D.C. control potential to each upper rank transistor pair, poled for double balanced operation to produce an r.f. output quantity whose phase is continuously variable within said phase difference from a virtual lead to a virtual lag, each being substantially less than 90°, for inducing a compensatory reactance change in said resonant circuit, and a corresponding change in the phase and frequency of resonance of said oscillator.

2. A voltage controlled r.f. oscillator as in claim 1 wherein said phase shift network comprises a resistance connected in the current path between the collector of said third transistor and the emitters of said first pair of transistors and the capacitance to ground of the collector of said third transistor.

3. A voltage controlled r.f. oscillator as in claim 2 wherein said capacitance to ground is supplemented by the additional collector base capacity of an additional semiconductor junction.

4. A voltage controlled r.f. oscillator as in claim 3 wherein said phase shift network provides a phase shift lying within the range of from 20° to 50°.

5. A voltage controlled r.f. oscillator as in claim 4 wherein a capacitance is provided coupled in shunt with the base of said third transistor to establish a parasitic delay around said loop substantially equal to one-half said phase difference.

* * * * *